(12) United States Patent
Yamazaki

(10) Patent No.: US 8,907,868 B2
(45) Date of Patent: Dec. 9, 2014

(54) DISPLAY DEVICE AND ELECTRONIC APPARATUS

(75) Inventor: Yu Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1640 days.

(21) Appl. No.: 12/269,921

(22) Filed: Nov. 13, 2008

(65) Prior Publication Data

US 2009/0073093 A1 Mar. 19, 2009

Related U.S. Application Data

(62) Division of application No. 11/032,158, filed on Jan. 11, 2005, now Pat. No. 7,453,426.

(30) Foreign Application Priority Data

Jan. 14, 2004 (JP) ................................ 2004-007387

(51) Int. Cl.
| | | |
|---|---|---|
| G09G 3/30 | (2006.01) | |
| G09G 3/20 | (2006.01) | |
| H01L 27/32 | (2006.01) | |
| G09G 3/00 | (2006.01) | |
| H04M 1/02 | (2006.01) | |
| H01L 51/52 | (2006.01) | |

(52) U.S. Cl.
CPC .......... *G09G 3/20* (2013.01); *G09G 2310/0262* (2013.01); *G09G 3/00* (2013.01); *G09G 3/30* (2013.01); *G09G 2300/0443* (2013.01); *H04M 2250/52* (2013.01); *G09G 2310/0251* (2013.01); *G09G 2310/0267* (2013.01); *H04M 1/0214* (2013.01); *G09G 2300/0426* (2013.01); *H04M 2250/16* (2013.01); *G09G 2300/0465* (2013.01); *G09G 2300/0847* (2013.01); *G09G 2300/0809* (2013.01); *H01L 27/3267* (2013.01); *H01L 51/5271* (2013.01)
USPC ................. 345/76; 345/80; 345/1.1

(58) Field of Classification Search
USPC ................................. 345/76, 80, 1.1
See application file for complete search history.

(56) References Cited

U.S. PATENT DOCUMENTS

| 5,652,067 A | 7/1997 | Ito |
|---|---|---|
| 5,780,174 A | 7/1998 | Tokito |

(Continued)

FOREIGN PATENT DOCUMENTS

| EP | 0 845 924 | 6/1998 |
|---|---|---|
| EP | 1 119 222 | 7/2001 |

(Continued)

OTHER PUBLICATIONS

Written Opinion (Application No. PCT/JP2004/000204 in Japanese) with partial English translation; Jun. 1, 2004, 6 pages.

(Continued)

*Primary Examiner* — William Boddie
*Assistant Examiner* — Leonid Shapiro
(74) *Attorney, Agent, or Firm* — Fish & Richardson P.C.

(57) ABSTRACT

According to one feature of the invention, a display device comprises a pixel including a first sub-pixel having a first light-emitting element and a second sub-pixel having a second light-emitting element, a first source driver connected to a first source line included in the first sub-pixel, and a second source driver connected to a second source line included in the second sub-pixel. The first sub-pixel and the second sub-pixel are provided over one surface of a light-transmitting substrate, and a first display region using the first sub-pixel over one surface of the substrate and a second display region using the second sub-pixel over the opposite surface the substrate are provided. Accordingly, it is possible to provide a display device that realizes sophistication and a high added value, which includes a display region in each of one and the opposite sides.

46 Claims, 10 Drawing Sheets

(56) References Cited

U.S. PATENT DOCUMENTS

| | | |
|---|---|---|
| 6,284,393 B1 | 9/2001 | Hosokawa |
| 6,333,065 B1 | 12/2001 | Arai |
| 6,747,609 B2 | 6/2004 | Antila |
| 7,608,992 B2 | 10/2009 | Kobayashi |
| 7,629,611 B2 | 12/2009 | Inukai |
| 2003/0063243 A1* | 4/2003 | Roosendaal et al. .......... 349/113 |
| 2004/0245531 A1 | 12/2004 | Fuii |
| 2004/0263064 A1 | 12/2004 | Huang |
| 2010/0073352 A1 | 3/2010 | Inukai |

FOREIGN PATENT DOCUMENTS

| | | | |
|---|---|---|---|
| JP | 06-013184 | | 1/1994 |
| JP | 06-096858 | | 4/1994 |
| JP | 09-180883 | | 7/1997 |
| JP | 10-162959 | | 6/1998 |
| JP | 11-045779 | | 2/1999 |
| JP | 2001-249627 A | | 9/2001 |
| JP | 2001-285445 | | 10/2001 |
| JP | 2001-319776 | | 11/2001 |
| JP | 2003-152185 A | | 5/2003 |
| JP | 3408154 | | 5/2003 |
| JP | 2003-345271 | | 12/2003 |
| JP | 2004-086014 A | | 3/2004 |
| KR | 2002-0094424 | * | 12/2002 |
| WO | 2004/026001 A1 | | 3/2004 |

OTHER PUBLICATIONS

International Search Report (Application No. PCT/JP2004/000204 in Japanese); Jun. 1, 2004, 3 pages.

* cited by examiner

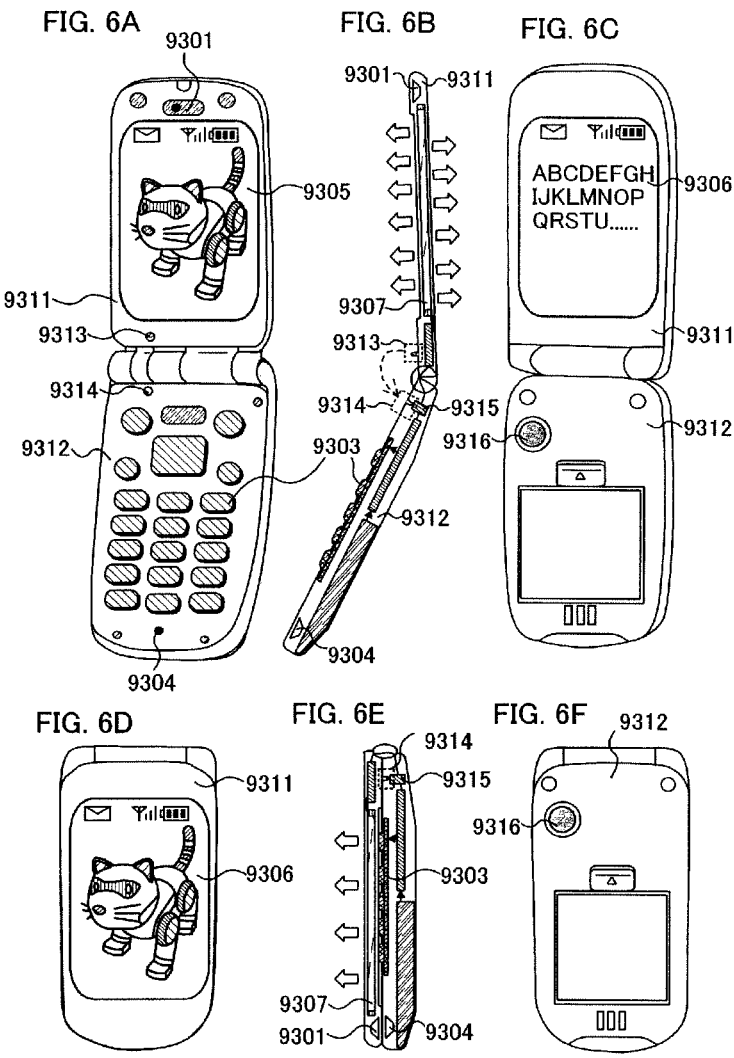

ORDINARY DISPLAY

HORIZONTALLY REVERSED DISPLAY

180° REVERSED DISPLAY

VERTICALLY REVERSED DISPLAY

DISPLAY DEVICE AND ELECTRONIC APPARATUS

CROSS-REFERENCE TO RELATED APPLICATIONS

This application is a divisional of U.S. application Ser. No. 11/032,158, filed Jan. 11, 2005, now allowed, which claims the benefit of a foreign priority application filed in Japan as Serial No. 2004-007387 on Jan. 14, 2004, both of which are incorporated by reference.

BACKGROUND OF THE INVENTION

1. Field of the Invention

The present invention relates to a display device having a self-luminous element.

2. Description of the Related Art

In recent years, a display device having a self-luminous element typified by electroluminescence (EL, Electro Luminescence) element or the like has been developed. It is expected that this display device be used widely by making the most of the advantage such as a high image quality and a wide viewing angle because of the self-luminous and thin shape and lightweight without the necessity of a backlight. Incidentally, a high added value of a mobile terminal is required by diversifying the purpose of use. Recently, a mobile terminal equipped with a sub-display surface on the side opposite to the ordinary display surface has been provided (see Reference 1: Japanese Patent Laid-Open No. 2001-285445).

In a mobile terminal equipped with a sub-display surface in addition to an original display surface, not only capacity occupied by a module including a backlight or the like but also capacity occupied by a printed wiring board or the like on which control ICs for driving the original display surface and the sub-display surface is mounted cannot be ignored. Particularly a mobile terminal that is recently provided is remarkably made lighter and more compact, which is a trade-off with a tendency to heighten the added value.

SUMMARY OF THE INVENTION

Accordingly, in view of the above situation, an object of the present invention is to provide a display device that realizes a high added value by using a panel capable of downsizing the capacity. In addition, an object of the invention is to provide a display device that realizes sophistication.

The following means is taken according to the invention to solve the above-mentioned conventional problem.

According to one of features of the invention, a display device comprises a pixel including a first sub-pixel having a first light-emitting element and a second sub-pixel having a second light-emitting element, a first source driver connected to a first source line included in the first sub-pixel, and a second source driver connected to a second source line included in the second sub-pixel. The first source driver supplies a first video signal for the first sub-pixel, and the second source driver supplies a second video signal for the second sub-pixel.

A pixel electrode and an opposite electrode of a first light-emitting element have light-transmitting properties, a pixel electrode of a second light-emitting element has reflectiveness, an opposite electrode of the second light-emitting element has light-transmitting properties, electroluminescent layers of the first light-emitting element and the second light-emitting element are provided in the same layer, the opposite electrodes of the first light-emitting element and the second light-emitting element are provided in the same layer, and a reflective layer overlapping with the opposite electrode of the first light-emitting element is provided.

In addition, according to one of features of the invention, pixel electrodes and opposite electrodes of a first light-emitting element and a second light-emitting element have light-transmitting properties; electroluminescent layers of the first light-emitting element and the second light-emitting element are provided in the same layer; the opposite electrodes of the first light-emitting element and the second light-emitting element are provided in the same layer; and a first reflective layer overlapping with the opposite electrode of the first light-emitting element, and a second reflective layer overlapping with the pixel electrode of the second light-emitting element are provided.

In addition to the above structures, according to another feature of the invention, a display device comprises a gate driver connected to a first gate line included in a first sub-pixel, and a second gate line included in a second sub-pixel. This gate driver controls operation of a transistor which controls supply of a video signal for the first sub-pixel and the second sub-pixel. Alternatively, according to another feature of the invention, a first gate driver that is connected to a first gate line included in the first sub-pixel and a second gate driver that is connected to a second gate line included in the second sub-pixel are provided. The first gate driver controls operation of a transistor which controls supply of a first video signal for the first sub-pixel. The second gate driver controls operation of a transistor which controls supply of a second video signal for the second sub-pixel.

According to another feature of a display device of the invention, a first sub-pixel and a second sub-pixel are provided over one surface of a light-transmitting substrate, and a first display region with the use of the first sub-pixel over one surface of the substrate and a second display region with the use of the second sub-pixel over the surface opposite to the one surface of the substrate are provided.

In addition, according to another feature of the invention, the numbers of TFTs included in each of the first sub-pixel and the second sub-pixel are the same. Alternatively, the numbers of TFTs included in each of the first sub-pixel and the second sub-pixel are different. Furthermore, according to another feature of the invention, the first source driver is connected to a digital data line or an analog data line, and the second source driver is connected to a digital data line or an analog data line.

In addition, according to another feature of the invention, the first light-emitting element and the second light-emitting element emit red, green, or blue light. Alternatively, according to another feature of the invention, the first light-emitting element and the second light-emitting element emit white light, or the first light-emitting element and the second light-emitting element emit blue light.

In addition, according to another feature of the invention, a color display is performed in the first display region, and a color display is performed in the second display region. Alternatively, according to another feature of the invention, a color display is performed in the first display region and a monochrome display is performed in the second display region, or a monochrome display is performed in the first display region and a monochrome display is performed in the second display region.

In addition, according to another feature of the invention, a counter substrate which is opposed to the substrate is provided, and a color filter is provided for one or both of one surface of the substrate and one surface of the counter substrate. Moreover, according to another feature of the invention, a counter substrate which is opposed to the substrate is provided, and a color conversion layer is provided for one or both of one surface of the substrate and one surface of the counter substrate.

According to the invention having the above-mentioned features, it is possible to provide a display device that realizes sophistication and a high added value, which includes a display region in each of the opposite sides. Capacity of the module can be downsized compared with the case in which two panels are used to equip each of the opposite sides with a display region. Therefore, a display device in which small size, thin shape, and lightweight are realized can be provided.

These and other objects, features and advantages of the present invention will become more apparent upon reading of the following detailed description along with the accompanied drawings.

BRIEF DESCRIPTION OF THE DRAWINGS

FIGS. 6A to 6F are each a view illustrating Embodiment 4 according to certain aspects of the invention;

DETAILED DESCRIPTION OF THE INVENTION

Figure 1A:
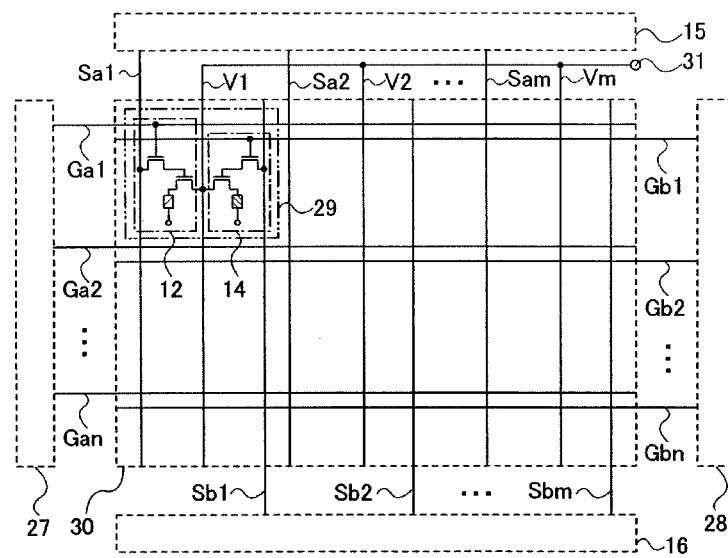
FIGS. 1A and 1B are each a diagram illustrating Embodiment Mode according to certain aspects of the present invention.

Embodiment Mode of the present invention will be described in detail with reference to the accompanying drawings. However, the invention is not limited to the following explanations, and those skilled in the art easily understand that the mode and details can be variously changed without departing from the content and scope of the invention. Therefore, the invention is not interpreted with limiting to the description in this embodiment mode. Note that, in the following explanations, reference numeral denoting the same parts is used in common among different drawings.

Embodiment Mode

A display device of the invention has a pixel portion 30 in which a plurality of first source lines Sa1 to Sam (hereinafter referred to as source lines Sa1 to Sam, and "m" indicates a natural number), a plurality of second source lines Sb1 to Sbm (hereinafter referred to as source lines Sb1 to Sbm), a plurality of first gate lines Ga1 to Gan (hereinafter referred to as gate lines Ga1 to Gan, and "n" indicates a natural number), and a plurality of second gate lines Gb1 to Gbn (hereinafter referred to as gate lines Gb1 to Gbn) are arranged in a matrix (see FIG. 1A). The pixel portion 30 comprises a plurality of pixels 29 equipped with a first sub-pixel 12 (hereinafter referred to as a sub-pixel 12) in which a plurality of elements is included in a region where a source line Sax ("x" indicates a natural number, which satisfies $1 \leq x \leq m$) and a gate line Gay ("y" indicates a natural number, which satisfies $1 \leq y \leq n$) are intersected through an insulator, and a second sub-pixel 14 (hereinafter referred to as a sub-pixel 14) in which a plurality of elements is included in a region where a source line Sbx and a gate line Gby are intersected through an insulator.

The display device of the invention includes a first source driver 15 (hereinafter referred to as a source driver 15) to be connected to the plurality of source lines Sa1 to Sam, a second source driver 16 (hereinafter referred to as a source driver 16) to be connected to the plurality of source lines Sb1 to Sbm, a first gate driver 27 (hereinafter referred to as a gate driver 27) to be connected to the plurality of gate lines Ga1 to Gan, and a second gate driver 28 (hereinafter referred to as a gate driver 28) to be connected to the plurality of gate lines Gb1 to Gbm. The source driver 15 supplies the sub-pixel 12 with a video signal, and the source driver 16 supplies the sub-pixel 14 with a video signal. In addition, the gate driver 27 supplies the sub-pixel 12 with a gate selection signal, and the gate driver 28 supplies the sub-pixel 14 with a gate selection signal. The source drivers 15 and 16 and the gate drivers 27 and 28 comprise a shift register, a latch, a buffer, a sampling circuit, and the like.

According to the above-mentioned structure, the gate driver 27 that controls the sub-pixel 12 and the gate driver 28 that controls the sub-pixel 14 are provided; however, the invention is not limited to this structure. In other words, both the sub-pixels 12 and 14 may be controlled by one gate driver. Thus, a gate driver to be connected to the plurality of gate lines Ga1 to Gan and the plurality of gate lines Gb1 to Gbm may be provided.

Figure 1B:
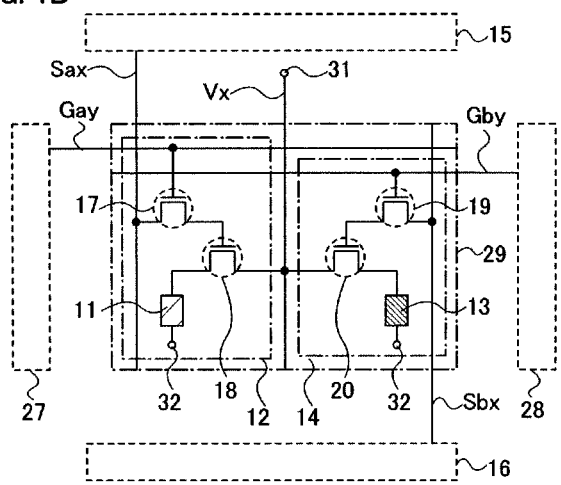

The sub-pixel 12 includes a first light-emitting element 11 (hereinafter referred to as a light-emitting element 11), a switching transistor 17 (hereinafter referred to as a TFT 17), and a driving transistor 18 (hereinafter referred to as a TFT 18) in a region where the source line Sax and the gate line Gay are intersected through an insulator (see FIG. 1B). The sub-pixel 14 includes a second light-emitting element 13 (hereinafter referred to as a light-emitting element 13), a switching transistor 19 (hereinafter referred to as a TFT 19), and a driving transistor 20 (hereinafter referred to as a TFT 20) in a region where the source line Sbx and gate line Gby are intersected through an insulator. Since the sub-pixels 12 and 14 having the above-mentioned structure have two TFTs, respectively, of which number is small, enhancement of a yield during the manufacturing process is achieved. In addition, the pixels have advantage in terms of layout, and enhancement of an aperture ratio is achieved.

The light-emitting elements 11 and 13 each have a structure in which an electroluminescent layer is sandwiched between a pair of electrodes. Among the pairs of electrodes included in each of the light-emitting elements 11 and 13, one electrode is connected to a power supply 31 through the TFT 18 or the TFT 20 and a power supply line Vx, and the other electrode is connected to an opposite power supply 32. Among the pairs of electrodes included in each of the light-emitting elements 11 and 13, the electrodes connected to the TFT 18 and 20 are referred to as pixel electrodes, and the other electrodes are referred to as opposite electrodes. Note that, in the above structure, the sub-pixels 12 and 14 have the power supply line Vx in common. This structure achieves further enhancement of the aperture ratio. However, the invention is not limited to the above structure, and the power supply lines may be provided separately in each of the sub-pixels 12 and 14.

The TFTs 17 and 19 each have the function of controlling input of the video signals to each of the sub-pixels 12 and 14. The signals are transmitted from the gate drivers 27 and 28 to the gate electrodes of the TFTs 17 and 19 through the gate lines Gay and Gby. Based on the signals transmitted from the gate drivers 27 and 28, each of the sub-pixels 12 and 14 are supplied with the video signals from the source drivers 15 and 16 when the TFTs 17 and 19 are turned ON.

The TFTs 18 and 20 each have the function of controlling each lighting or non-lighting of the sub-pixels 12 and 14. The gate electrodes of the TFTs 18 and 20 are supplied with the video signals through the TFTs 17 and 19. Based on the video signals, the potential of the power supply line Vx is transmitted to the pixel electrodes of the light-emitting elements 11 and 13 when the TFTs 18 and 20 are turned ON. Accordingly, a voltage of a forward bias is applied between the both electrodes of the light-emitting elements 11 and 13. Consequently, current flows to the light-emitting elements 11 and 13, and thus, the luminescence is obtained.

Although it is not shown in the figure, the sub-pixels 12 and 14 may be provided with a capacitor element that holds the gate-source voltage (hereinafter referred to as VGS) of the TFTs 18 and 20. However, the capacitor that holds the VGS of the TFTs 18 and 20 may use a gate capacitor or a wiring capacitor. In addition, the conductivity types of the TFTs 17 to 20 are not particularly limited, and either N-type conductivity or P-type conductivity may be accepted. Moreover, the circuit configuration of the sub-pixels 12 and 14 are not limited to the above, and various circuit configurations are applicable. The structure except the above is hereinafter described in Embodiments.

Figure 2A:
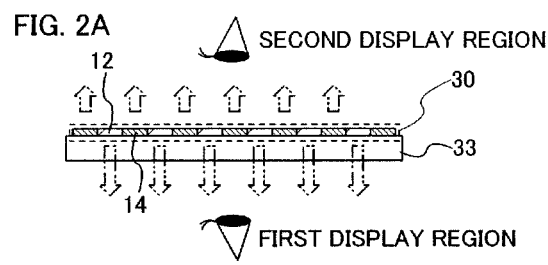
FIGS. 2A to 2C are each a view illustrating Embodiment Mode according to certain aspects of the invention.

The display device of the invention are equipped with a pixel portion 30 comprising a plurality of pixels including sub-pixels 12 and 14 on one side of a light-transmitting substrate 33 (see FIG. 2A). A light-emitting element 11 included in the sub-pixel 12 emits light in the direction of the substrate 33, and a light-emitting element 13 included in the sub-pixel 14 emits light in the opposite direction of the substrate 33. Accordingly, a first display region using the sub-pixel 12 is provided on one side of the substrate 33, and a second display region using the sub-pixel 14 is provided on the side opposite to one side of the substrate 33. In other words, the display device of the invention has the display regions on one and the opposite sides of the light-transmitting substrate 33, respectively.

The sub-pixel 12 is controlled by the source driver 15 and the gate driver 27, and the sub-pixel 14 is controlled by the source driver 16 and the gate driver 28. In other words, although the sub-pixels 12 and 14 are provided over the substrate 33, the sub-pixels are controlled by different drivers. Consequently, different images can be displayed in the first display region and the second display region, respectively. Of course, the same images can be also displayed in the first display region and the second display region.

In the case of the structure illustrated in above FIG. 2A, the first display region using the sub-pixel 12 and the second display region using the sub-pixel 14 are the same in size. However, the invention is not limited to this structure. A pixel portion 30 may be divided into a plurality of regions (two regions in FIG. 10A), either a sub-pixel 12 or a sub-pixel 14 (only the sub-pixel 14 in FIG. 10A) may be provided in a region 23, and the both the sub-pixels 12 and 14 may be provided in a region 21 (see FIGS. 10A and 10B). According to this structure, the size of the first display region equals to the size shown in the region 21, and the size of the second display region equals to the size shown in a region 22. In other words, the first display region and the second display region can be formed in different size from each other.

Figure 10A:
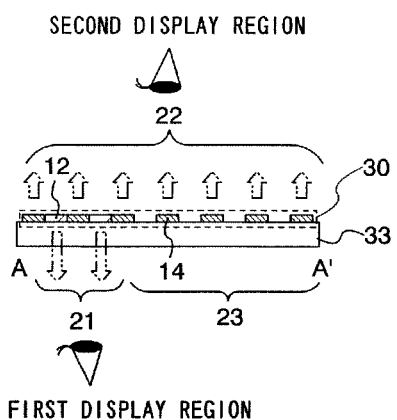
Figure 10B:
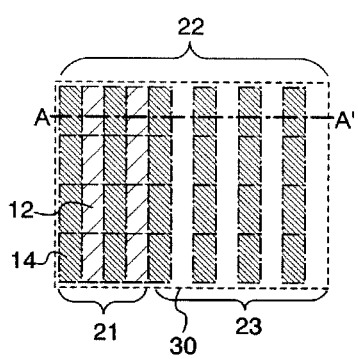
Figure 10C:
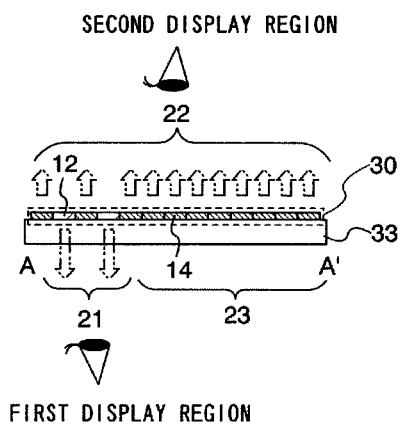
Figure 10D:
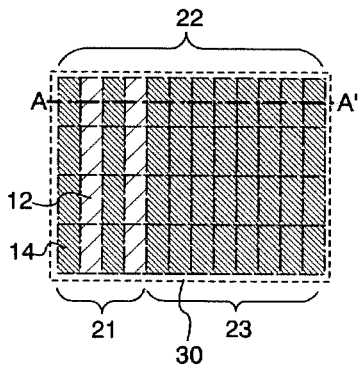

In addition, in the case of the structures shown in FIGS. 10A and 10B, only the sub-pixel 14 is provided without providing the sub-pixel 12 in the region 23; however, the invention is not limited to this structure. In a region 23, the sub-pixel 14 may be formed in the place where the sub-pixel 12 is to be formed (see FIGS. 10C and 10D). In this structure, also, the size of the first display region equals to the size shown in a region 21, and the size of the second display region equals to the size shown in a region 22. In other words, the first display region and the second display region can be formed in different size with each other. However, according to this structure, the second display region has different pixel density in the regions 21 and 23. Therefore, the images displayed in the regions 21 and 23 may be appropriately changed by, for example, providing an icon showing a remaining battery level, wave intensity, or the like in the region 21 and providing an e-mail message or the like in the region 23 of the second display region.

Figure 2B:
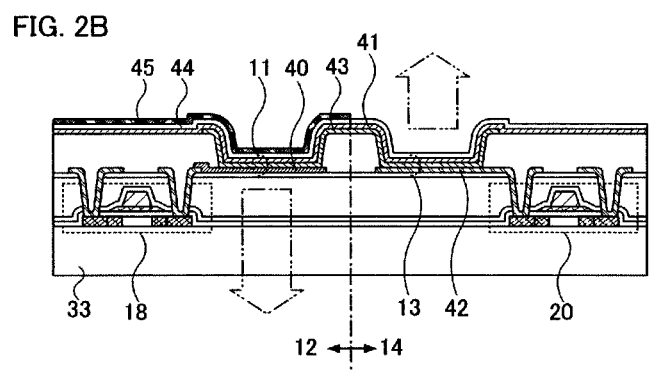
Figure 2C:
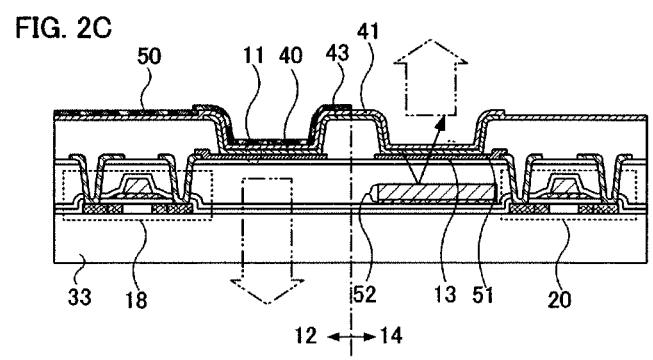

Hereinafter, the structures of the light-emitting element 11 which emits light in the direction of the substrate 33 and the light-emitting element 13 which emits light in the opposite direction of the substrate 33 are explained with reference to cross-sectional views by taking the two cases as examples (FIGS. 2B and 2C). Note that, in the both cases, an electroluminescent layer 43 and an opposite electrode 41 of the light-emitting elements 11 and 13 are provided in the same layer.

First, as the first structure, the case in which both a pixel electrode 40 and the opposite electrode 41 of the light-emitting element 11 have light-transmitting properties, a pixel electrode 42 of the light-emitting element 13 has reflectiveness, and the opposite electrode 41 of the light-emitting element 13 has light-transmitting properties is shown (see FIG. 2B). This structure has a feature that a reflecting layer 45 overlapping with the opposite electrode 41 of the light-emitting element 11 is provided. According to the above feature, the light-emitting element 11 emits light in the direction of the substrate 33, and the light-emitting element 13 emits light in the opposite direction of the substrate 33.

Next, a structure in which both a pixel electrode 40 and an opposite electrode 41 of a light-emitting element 11 have light-transmitting properties, and both a pixel electrode 51 and the opposite electrode 41 of a light-emitting element 13 have light-transmitting properties is shown (see FIG. 2C). This structure has a feature that a first reflecting layer 50 overlapping with the opposite electrode 41 of the light-emitting element 11 and a second reflecting layer 52 overlapping with the pixel electrode 51 of the second light-emitting element 13 are provided. According to the above feature, the light-emitting element 11 emits light in the direction of a substrate 33, and the light-emitting element 13 emits light in the opposite direction of the substrate 33.

Note that materials having reflectiveness may be used for the pixel electrode 42 having reflectiveness, the reflecting layer 45, the first reflecting layer 50, and the second reflecting layer 52. However, aluminum, which is superior in terms of reflectiveness and which is inexpensive or a material containing the aluminum, is preferably used. In addition, although FIG. 2B shows a structure in which an insulating layer 44 which functions as a protective layer is sandwiched between the opposite electrode 41 and the reflecting layer 45, the invention is not limited to this structure. As shown in FIG. 2C, the reflecting layer 45 may be provided to be in contact with the opposite electrode 41. Moreover, the structure shown in FIG. 2C uses a conductive layer in the same layer as gate electrodes of TFTs 18 and 20 as the second reflecting layer 52; however, the invention is not limited to this structure. In other words, the second reflecting layer 52 may be provided in any layer as long as it is formed below the pixel electrode 51. However, when the second reflecting layer 52 is formed in a place apart from the pixel electrode 51, unnecessary reflected light increases inside the panel. Thus, in terms of efficiency in extracting light, the second reflecting layer 52 may be formed to be in contact with the pixel electrode 51, or the pixel electrode 51 may be formed from a reflective material.

According to the invention having the above-mentioned features, it is possible to provide a display device that realizes sophistication and a high added value, which includes a display region in each of one and the opposite sides. Capacity of the module can be downsized compared with the case in which two panels are provided on each of one and the opposite sides. Therefore, a display device in which small size, thin shape, and lightweight are realized can be provided.

Embodiment 1

Figure 3A:
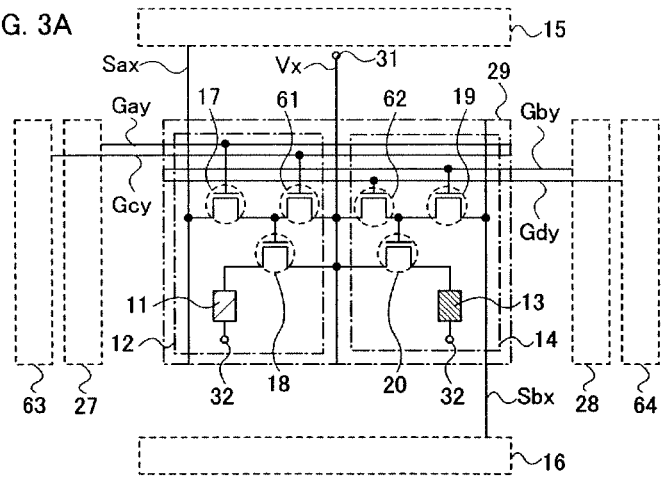
FIGS. 3A and 3B are each a diagram illustrating Embodiment 1 according to certain aspects of the invention.

In this embodiment, circuit configurations of the sub-pixels are explained with reference to drawings. First, a structure comprising three TFTs in a sub-pixel (3TFT/Cell) is explained (see FIG. 3A). This is a structure in which TFTs (erase TFTs) 61 and 62, gate lines Gcy (which satisfies 1≤y≤n, and "n and y" indicate a natural number) and Gdy (which satisfies 1≤y≤m, and "y" indicates a natural number), and gate drivers 63 and 64 are newly arranged in the structure shown in FIG. 1B. Current can be compulsorily made not to flow to light-emitting elements 11 and 13 by arranging the TFTs 61 and 62. Therefore, a lighting period can be started at the same time as or just after a start of a writing period without waiting for writing a signal in all sub-pixels. As a result, the duty ratio can be improved and a favorable moving image display can be performed.

Figure 3B:
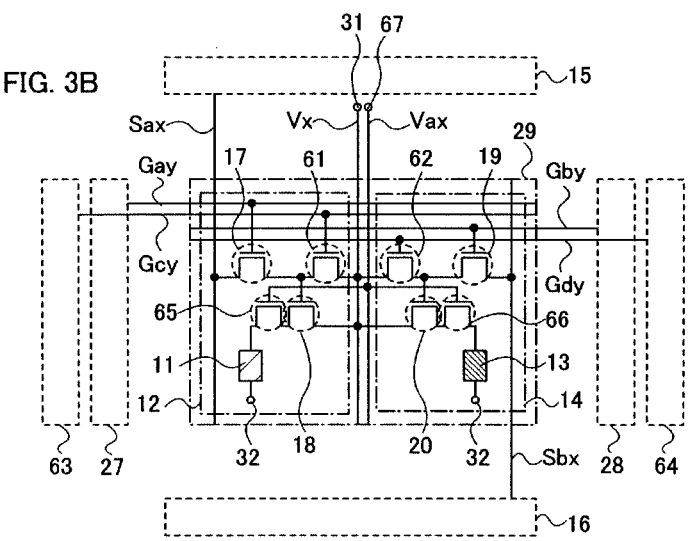

Next, a structure comprising four TFTs in a sub-pixel (4TFT/Cell) is explained (see FIG. 3B). This is a structure in which TFTs 65 and 66, a power supply line Vax (which satisfies 1≤x≤m, and "y" indicates a natural number), and a power supply 67 are newly arranged in a structure shown in FIG. 3A. The gate electrodes of the TFTs 65 and 66 are connected to the power supply line Vax which is held in a constant potential. In other words, the potentials of the gate electrodes of the TFTs 65 and 66 are fixed. The TFTs 65 and 66 are operated in a saturation region to make current flow constantly. TFTs 18 and 20 are operated in a linear region. According to the above-mentioned structure, the value of a source-drain voltage (VDS) of the TFTs 18 and 20 operated in a linear region is small. Therefore, slight variation between a gate-source voltage (VGS) of the driving TFTs 18 and 20 does not affect the values of current flown to the light-emitting elements 11 and 13. Thus, the current values flown to the light-emitting elements 11 and 13 depend on a source-drain current of the TFTs 65 and 66 operated in a saturation region. Consequently, luminance unevenness of the TFTs 65 and 66 due to variation in characteristics of the TFTs 18 and 20 can be improved to enhance the image quality. Note that a channel length $L_1$ and a channel width $W_1$ of the TFTs 18 and 20 and a channel length $L_2$ and a channel width $W_2$ of the TFTs 65 and 66 may be set to satisfy $L_1/W_1:L_2/W_2=5$ to 6000:1 in order to operate each TFT in a linear region or a saturation region.

Note that circuit configurations of sub-pixels 12 and 14 included in a pixel 29 may have the same structures (the same number of TFTs) or may have different structures (the different number of TFTs) from each other. In the case of the structures different from each other, for example, 4TFT/Cell may be employed for sub-pixels which is included in a main display region for displaying moving image or an image of high-definition is performed, and 2TFT/Cell may be employed for sub-pixels which is included in a sub display region in which a still image display is performed. In this manner, the circuit configurations may be separately formed depending on the application of the display regions. This embodiment can be arbitrarily combined with the above-mentioned embodiment mode.

Embodiment 2

A panel, which is one mode of a display device of the present invention, is explained with reference to drawings. Here, a panel in which a pixel portion and a driver are integrally formed is explained. The panel comprises a pixel portion 30, source drivers 15 and 16, gate drivers 27 and 28, a connection terminal 72, and a connection film 71 provided over a substrate 33 (see FIGS. 4A and 4B). The connection terminal 72 is connected to the connection film 71 through conductive particles. The connection film 71 is connected to an IC chip (not shown in the figure).

Figures 4A, 4B:
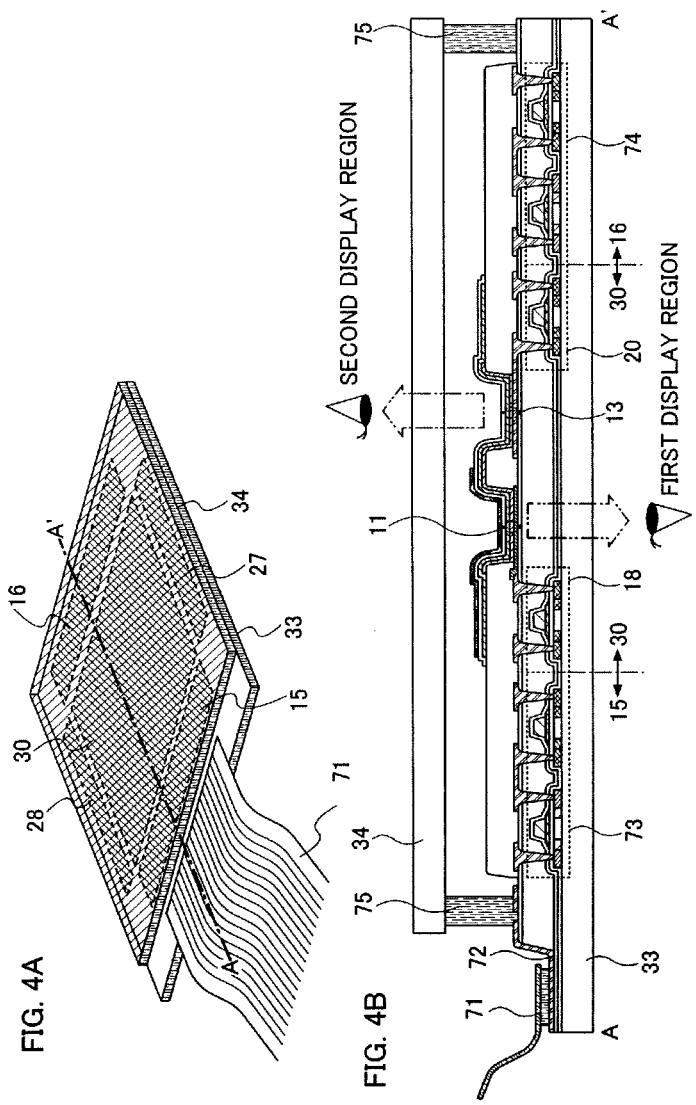
FIGS. 4A and 4B are each a view illustrating Embodiment 2 according to certain aspects of the invention.

FIG. 4B shows a cross-sectional view taken along a line A-A' of the panel and shows TFTs 18 and 20 and light-emitting elements 11 and 13 included in the pixel portion 30. In addition, elements 73 included in the source driver 15 and elements 74 included in the source driver 16 are shown. A sealant 75 is provided in a periphery of the pixel portion 30 and the drivers 15, 16, 27, and 28, and the light-emitting elements 11 and 13 are sealed by sealant 75 and a counter substrate 34. This sealing process is a process to protect the light-emitting elements 11 and 13 from the substance that becomes deteriorating factor, for example, moisture. Although a method for sealing with the use of a cover material (glass, ceramics, plastics, metal, or the like) is used here, a method for sealing with the use of thermosetting resin or ultraviolet curable resin may be used. Alternatively, a method for sealing with the use of a thin film of which barrier ability is high, for example, metal oxide, nitride, or the like may be used.

A TFT in which any one of an amorphous semiconductor, a microcrystal semiconductor, a crystalline semiconductor, and an organic semiconductor is employed for the channel portion is acceptable to the elements formed over the substrate 33. However, the elements are preferably formed from the crystalline semiconductor superior in characteristics such as mobility in comparison with the amorphous semiconductor. Accordingly, monolithic device over one surface is achieved. Since the drivers are integrally formed in the panel having the above structure, the number of external ICs to be connected is decreased, and thus, a small-size, thin-shaped, and lightweight display device is realized.

Note that, in FIG. 4B, light emitted from the light-emitting element 11 is emitted in the direction of the substrate 33 as indicated by an arrow. Such a structure is referred to as a bottom emission type. On the other hand, light emitted from the light-emitting element 13 is emitted in the direction of the counter substrate 34 as indicated by an arrow. Such a structure is referred to as a top emission type. In addition, in FIG. 4B, each of source electrodes or drain electrodes of the TFTs 18 and 20 and the pixel electrodes of the light-emitting elements 11 and 13 are laminated in the same layer without sandwiching an insulating layer therebetween. According to this structure, regions where the pixel electrodes of the light-emitting elements 11 and 13 are formed are identical with a region excluding a region where the TFTs 18 and 20 are arranged. Accordingly, the decrease of aperture ratio is inevitable due to high definition or the like of the pixel. Therefore, an interlayer film may be additionally provided to provide the pixel electrodes in the separated layer. Thus, enhancement of the aperture ratio is achieved by effectively utilizing the region where the TFTs are arranged.

In addition, an optical film such as a half-wave plate, a quarter-wave plate, and a polarizing plate may be provided over one surface of the substrate 33 and one surface of the counter substrate 34. When a wave plate or a polarizing plate is provided, unnecessary light generated due to reflection inside the panel is reduced, and thus, a fine black display and a high contrast are realized. An angle between two pieces of polarizing plates may be range from 40° to 90°, preferably from 70° to 90°, and more preferably it may be set to 90°.

Note that the structure of the display device according to the invention is not limited to the above description. For example, the pixel portion 30 may comprise a TFT in which the amorphous semiconductor serves as a channel portion, and the drivers 15, 16, 27, and 28 may comprise IC chips. The IC chips may be attached to the substrate 33 by a COG method or may be attached to the connection film 71 connected to the substrate 33. The amorphous semiconductor can provide an inexpensive panel since it can be easily formed over a large-sized substrate by using a CVD method and a crystallization step is unnecessary. In addition, when a droplet discharge method such as an ink-jet method is used in conjunction in forming a conductive layer, a more inexpensive panel can be provided. This embodiment can be arbitrarily combined with the above-mentioned embodiment mode and embodiment.

Embodiment 3

According to the present invention, there are a first display region on the side of a substrate 33 and a second display region on the side of a counter substrate 34, and display in each display region is explained with reference to Tables 1 and 2.

enhancement of a yield is achieved since there is no necessity to color an electroluminescent layer separately. Furthermore, when a CF or a color conversion layer is employed, enhancement of a color purity or contrast is achieved.

When the color filter and the color conversion layer are employed, the color filter and the color conversion layer are provided over one or both of one surface of the substrate 33 and one surface of the counter substrate 34.

In both the first display region and the second display region of a light-emitting element included in a pixel, color display is performed in the case of RGB light emission or monochrome display is performed in the case of monochromatic light emission. When RGB light emission or monochromatic light emission is performed in a light-emitting element included in a pixel, color display or monochrome display is performed in both the first display region and the second display region. When white light emission or blue light emission is performed in a light-emitting element included in a pixel, color display or monochrome display is performed depending on existence or non-existence of the CF or the color conversion layer. When the CF or the color conversion layer is provided on one side of the substrate 33 and the counter substrate 34, one of the substrates can perform color display and the other can provide monochrome display.

TABLE 2

| First Source Driver 15 (Substrate 33 Side, First Display Region) | | Second Source Driver 16 (Counter Substrate 34 Side, Second Display Region) | |
|---|---|---|---|
| Analog Video Signal | Analog Display | Analog Video Signal | Analog Display |
| Analog Video Signal | Analog Display | Digital Video Signal | Digital Display |

TABLE 1

| Light Emitting Element | Substrate 33 Side (First Display Region) | | Counter Substrate 34 Side (Second Display Region) | |
|---|---|---|---|---|
| RGB Light Emission | Color Display | | Color Display | |
| White Light Emission | CF | Color Display | CF | Color Display |
| | CF | Color Display | No CF | Monochrome Display |
| | No CF | Monochrome Display | CF | Color Display |
| Blue Light Emission | Color Conversion Layer | Color Display | Color Conversion Layer | Color Display |
| | Color Conversion Layer | Color Display | No Color Conversion Layer | Monochrome Display |
| | No Color Conversion Layer | Monochrome Display | Color Conversion Layer | Color Display |
| Monochromatic Light Emission | Monochrome Display | | Monochrome Display | |

In Table 1, RGB light emission indicates the case when light emitted from a light-emitting element included in a pixel is red, green, or blue. White light emission indicates the case when light emitted from a light-emitting element included in a pixel is white. Blue light emission indicates the case when light emitted from a light-emitting element included in a pixel is blue. Monochromatic light emission indicates the case when light emitted from a light-emitting element included in a pixel is one color of red, green, and the like. CF indicates a color filter. When the RGB light emission is employed for a light-emitting element, enhancement of light usage efficiency is achieved. In addition, when white light emission or blue light emission is employed for the light-emitting element, TABLE 2-continued

| First Source Driver 15 (Substrate 33 Side, First Display Region) | | Second Source Driver 16 (Counter Substrate 34 Side, Second Display Region) | |
|---|---|---|---|
| Digital Video Signal | Digital Display | Analog Video Signal | Analog Display |
| Digital Video Signal | Digital Display | Digital Video Signal | Digital Display |

In Table 2, when both source drivers 15 and 16 supply each sub-pixel with an analog video signal or a digital video signal, the source drivers 15 and 16 are connected to an analog data line which transmits the analog video signal or a digital data line which transmits the digital video signal. Then, analog display or digital display is performed in the first display region and the second display region. In addition, when one of the source drivers 15 and 16 supplies an analog video signal and the other source driver supplies a digital video signal, one of the source drivers 15 and 16 is connected to an analog data line and the other source driver is connected to a digital data line. Then, analog display is performed in one of the first display region and the second display region, and digital display is performed in the other display region.

Accordingly, analog display can be performed in one display region and digital display can be performed in the other display region by separately using signals that are supplied to each sub-pixel by the source drivers 15 and 16. The display regions can be separately formed in such a manner, for example, when a main display region for displaying moving image or an image of high-definition is provided by digital display, and a sub display region for displaying a still image is provided by analog display. Since the number of times of writing the signal is small in the display region in which analog display is performed, power consumption of the source drivers can be inhibited. In addition, since the number of times of writing the signal is small, the frequency of the source drivers can be reduced enough, and thus, the signal writings can be performed accurately.

Note that, as mentioned above, either an analog video signal or a digital video signal may be used in the display device of the invention. However, in the case of using the digital video signal, there are a video signal using the voltage and a video signal using the current. In other words, the constant voltage or the constant current is used for the video signal inputted into the pixel when a light-emitting element emits light. When the constant voltage is used for the video signal, the voltage applied to the light-emitting element is constant, or the current flowing in the light-emitting element is constant. On the other hand, when the constant current is used for the video signal, the voltage applied to the light-emitting element is constant, or the current flowing in the light-emitting element is constant. The constant voltage applied to the light-emitting element is referred to as constant voltage driving, and the constant current flown to the light-emitting element is referred to as constant current driving. The constant current driving does not depend on the change of the resistance and the constant current flows. Either the video signal using the voltage or the video signal using the current may be used for the display device of the invention, and either the constant voltage driving or the constant current driving may be used. This embodiment can be arbitrarily combined with the above-mentioned embodiment mode and embodiments.

Embodiment 4

As an example of an electronic apparatus (electronic device) to which a display device of the present invention is applicable, a television apparatus (also referred to as a television receiver device, a television receiver, a television, or a television device), a camera such as a digital camera or a digital video camera, a cellular phone device (also referred to as a cellular phone handset or a cellular phone), a portable information terminal such as a PDA (Personal Digital Assistant), a portable game machine, a monitor, a personal computer, a tablet PC, an audio reproducing device such as a car audio, an image reproducing device provided with a recording medium such as a home-use game machine, or the like is given. Hereinafter, the specific examples are explained.

Figure 5A:
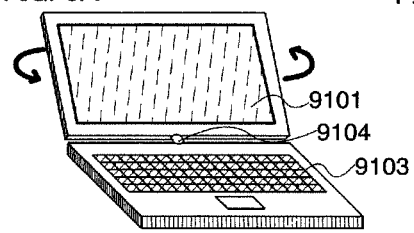
FIGS. 5A to 5D are each a view illustrating Embodiment 4 according to certain aspects of the invention.
Figure 5B:
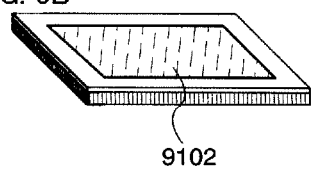
Figure 5C:
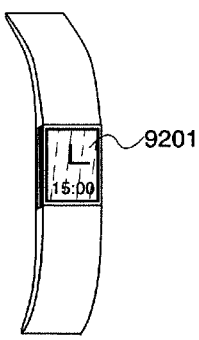
Figure 5D:
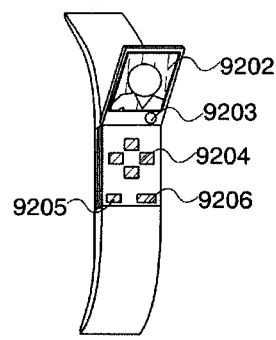

FIGS. 5A and 5B illustrate a tablet PC, which includes display regions 9101 and 9102, buttons 9103, a rotation axis 9104, and the like. The display region 9101 is used when the tablet PC is in the unfolded state (FIG. 5A), and the display region 9102 is used when the tablet PC is in the folded state (FIG. 5B). In addition, both the display regions 9101 and 9102 may be used both in the unfolded state and in the folded state by rotating the casing with the use of the rotation axis 9104. The invention is applicable to the display device including the display regions 9101 and 9102. FIGS. 5C and 5D illustrate a wristwatch portable terminal, which includes display regions 9201 and 9202, a camera 9203, buttons 9204, a microphone 9205, a speaker 9206, and the like. The invention is applicable to the display device including the display regions 9201 and 9202.

FIGS. 6A to 6F illustrate a foldable portable terminal, which includes a first casing 9311 having a speaker 9301 and a panel 9307; a second casing 9312 having a microphone 9304, buttons 9303, and a camera 9316; and the like. In this portable terminal, one or both of display regions 9305 and 9306 are used in the unfolded state, and the display region 9306 is used in the folded state. In addition, this portable terminal includes unfolding/folding detecting means that determines which of the first display region 9305 or the second display region 9306 is to be used. The unfolding/folding detecting means includes a protrusion 9313 provided for the first casing 9311, a hole 9314 and control means 9315 provided for the second casing 9312, and the like. In the folded state, the protrusion 9313 is in contact with the control means 9315 disposed below the hole 9314. In this state, the control means 9315 is set so that the ordinary display is performed in the first display region 9305. On the other hand, in the unfolded state, there is no protrusion 9313 being in contact with the control means 9315. In this state, the control means 9315 is set so that the ordinary display is performed in the second display region 9306. Note that the above-mentioned structure of the unfolding/folding detecting means is just an example and is not limited to the above description.

Figure 7A:
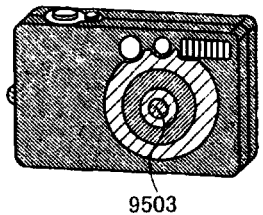
FIGS. 7A to 7D are each a view illustrating Embodiment 4 according to certain aspects of the invention.
Figure 7B:
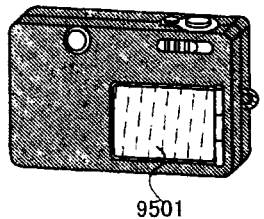
Figure 7C:
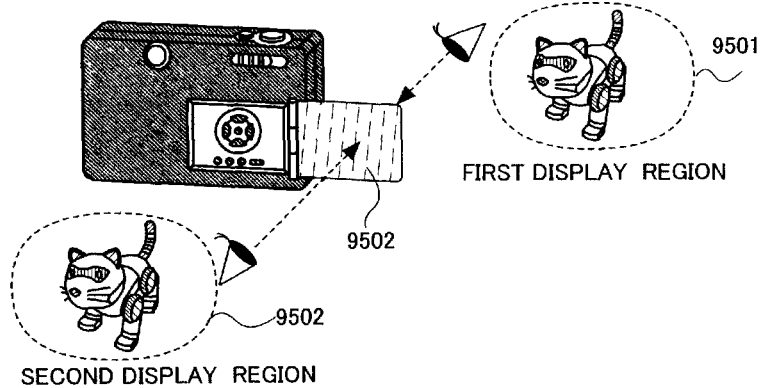
Figure 7D:
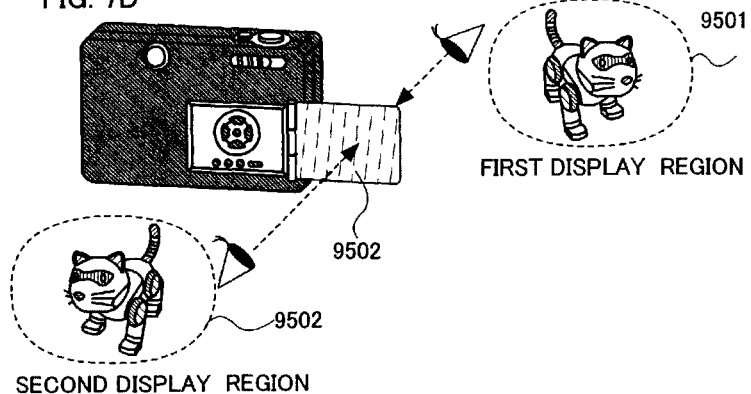

FIGS. 7A to 7C illustrate a digital camera, which includes a first display region 9501 (hereinafter referred to as a display region 9501), a second display region 9502 (hereinafter referred to as a display region 9502), a lens 9503, and the like. The invention is applicable to the display device including the display regions 9501 and 9502. FIG. 7B illustrates the state in which a panel including the display regions 9501 and 9502 is closed, and FIGS. 7C and 7D illustrate the opened state. In this digital camera, the display region 9501 is used in the closed state, and one or both of the display regions 9501 and 9502 are used in the opened state. When the same images are displayed as the ordinary display in the display regions 9501 and 9502 in the opened state, both a person who takes a picture and a person of whom picture is taken can simultaneously confirm the photography image (see FIG. 7C). In addition, horizontally reversed display may be performed in the display region 9501, and the ordinary display may be performed in the display region 9502 (see FIG. 7D). Performing horizontally reversed display in the display region 9501 in such a manner means that the person of whom picture is taken confirms a mirror image. In other words, the person of whom picture is taken can confirm its mirror image which is usually confirmed by using a mirror and thus can have a sense of comfort, and furthermore, it is possible to groom its appearance by using the mirror image. This embodiment can be arbitrarily combined with the above-mentioned embodiment mode and embodiments.

Embodiment 5

Figure 8:
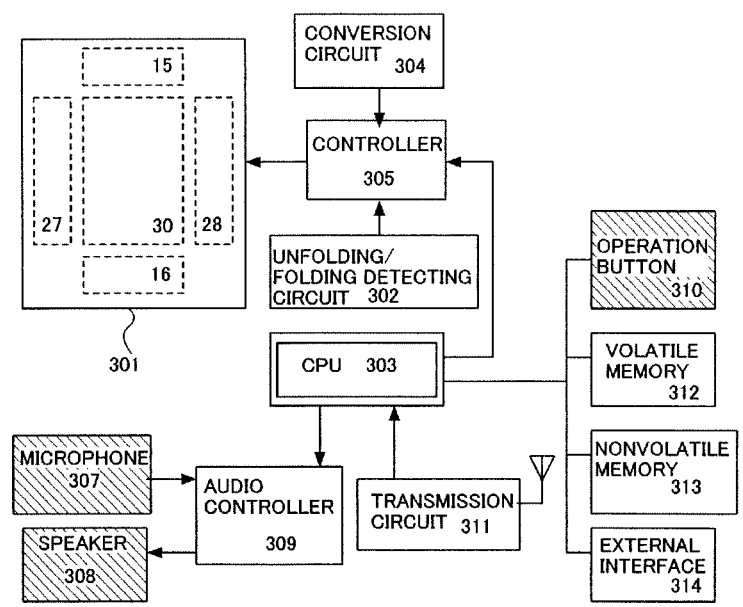
FIG. 8 is a diagram illustrating Embodiment 5 according to a certain aspect of the invention.

The components of a display device of the present invention and their relations are explained with reference to FIG. 8.

As the components of the display device of the invention, a panel 301 including a pixel portion 30, source drivers 15 and 16, and gate drivers 27 and 28; a conversion circuit 304; and a controller 305 are given. The conversion circuit 304 controls which of a first display region and a second display region disposed on the opposite sides are to be used to perform the ordinary display. In addition, if necessary, it controls to perform display selected from horizontally reversed display, 180° reversed display, and vertically reversed display. The controller 305 controls the operation of the panel 301.

An operation button 310, a volatile memory 312, a nonvolatile memory 313, and an external interface 314 are given as another components besides the above. These components are controlled by a CPU (Central Processing Unit) 303. Data such as a video signal is stored in the volatile memory 312 and nonvolatile memory 313.

When the invention is applied to a foldable electronic device, unfolding/folding detecting means 302 is provided as the components besides the above. The unfolding/folding detecting means 302 detects the folded state and the unfolded state and supplies the conversion circuit 304 with the information of the detection of the folded and unfolded states. The conversion circuit 304 controls which of a first display region and a second display region disposed on the opposite sides are to be used to perform the ordinary display based on the information supplied from the unfolding/folding detecting means 302. In addition, when the invention is applied to a cellular phone handset, a transmission circuit 311, a microphone 307 which is a transmitter portion, a speaker 308 which is a receiver portion, an audio controller 309, and the like are provided as the components besides the above.

Note that the invention is not limited to the above structure and may be equipped with other components. In addition, this embodiment can be arbitrarily combined with the above-mentioned embodiment mode and embodiments.

Embodiment 6

A display device of the present invention has a feature having display regions on the opposite sides. When both of the display regions on the opposite sides are used, the ordinary display is preferably performed in one display region, and horizontally reversed display is preferably performed in the other display region (see FIG. 7C). In such a manner, both persons who see a first display region and who see a second display region can confirm the same image simultaneously. Accordingly, switching of the display to be the ordinary display, the horizontally reversed display, or the like is explained in this embodiment with reference to FIGS. 9A to 9E.

As mentioned above, a panel includes a pixel portion 30 having (m×n) number of pixels, source drivers 15 and 16, and gate drivers 27 and 28. Here, the source driver 15 and the gate driver 27 are shown in the figure for simplicity to explain display in a first display region with the use of a first sub-pixel (see FIG. 9A).

A controller 305 determines a point where a start pulse is supplied according to a signal supplied from a conversion circuit 304 or unfolding/folding detecting means 302. Specifically, S-SP1 is provided when a sub-pixel is selected from the first column, S-SP2 is provided when a sub-pixel is selected from the m-th column, G-SP1 is provided when a sub-pixel is selected from the first row, and G-SP2 is provided when a sub-pixel is selected from the n-th row.

Figure 9A:
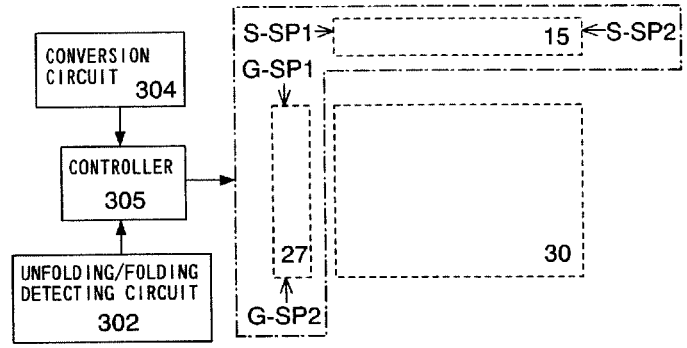
FIGS. 9A to 9E are each a diagram illustrating Embodiment 6 according to certain aspects of the invention and FIGS. 10A to 10D are each a diagram illustrating Embodiment Mode according to certain aspects of the invention.
Figure 9B:
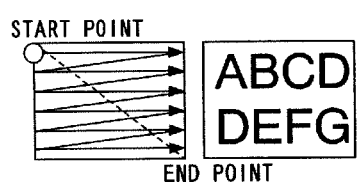
Figure 9C:
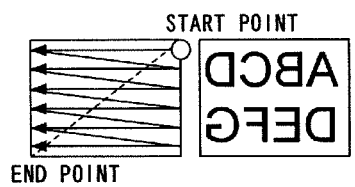
Figure 9D:
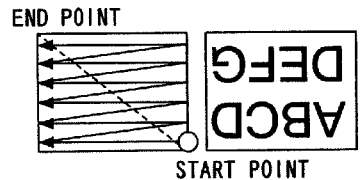
Figure 9E:
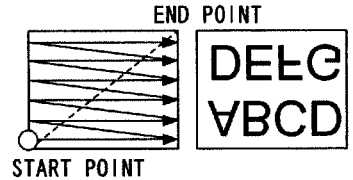

Then, in the case of performing the ordinary display, start pulses (S-SP1 and G-SP1) are supplied so that a sub-pixel arranged in the first column and first row is selected first (see FIG. 9B). In the case of performing horizontally reversed display, start pulses (S-SP2 and G-SP1) are supplied so that a sub-pixel arranged in the m-th column and the first row is selected first (see FIG. 9C). In the case of performing 180° reversed display, start pulses (S-SP2 and G-SP2) are supplied so that a sub-pixel arranged in the m-th column and the n-th row is selected first (see FIG. 9D). In the case of performing vertically reversed display, start pulses (S-SP1 and G-SP2) are supplied so that a sub-pixel arranged in the first column and the n-th row is selected first (see FIG. 9E). In such a manner, a point where a start pulse is supplied is changed depending on each display. In addition, the video signals supplied to the sub-pixels from the source driver 15 are appropriately changed.

Note that, in the case of applying a time gray scale method, a video signal is loaded into a recording medium and then converted into a video signal for a time gray scale as a method for expressing a gray scale. Therefore, in the case of applying the time gray scale method, the order of loading a video signal of the ordinary display may be changed depending on the video signals for displaying each of horizontally reversed display, 180° reversed display, and vertically reversed display, and these display stored in a recording medium to correspond to each display.

In addition, the switching of display may be performed according to button operation by the user. In other words, the direction of the ordinary display is set at an initial setup and, if necessary, the direction of the display may be changed by the user. In addition, in the case of a foldable electronic device, it preferable to set at an initial setup so that the ordinary display is performed in an internal display region in the unfolded state and that the ordinary display is performed in an external display region in the folded state.

In addition, an acceleration sensor that senses inclination is provided, and a signal is supplied from the acceleration sensor. Based on the supplied signal, which one of four sides of the display region is the bottom is determined, and display may be switched based on the decision. This embodiment can be arbitrarily combined with the above-mentioned embodiment mode and embodiments.

Embodiment 7

A light-emitting element, which is one of the components of the present invention, corresponds to a lamination body of a first conductive layer, an electroluminescent layer, and a second conductive layer provided over a surface of a substrate having an insulating surface such as glass, quartz, metal or an organic matter, and having light-transmitting properties. The light-emitting element may be any one of a lamination type in which the electroluminescent layer is made from a plurality of layers, a single-layer type in which the electroluminescent layer is made from a single layer, or a mixed type in which the electroluminescent layer is made from a plurality of layers of which boundary is indefinite. In addition, as a laminated structure of the light-emitting layer, there are a sequentially laminated structure in which a conductive layer which corresponds to an anode\an electroluminescent layer\a conductive layer which corresponds to a cathode are laminated from the bottom, and a reversely laminated structure in which a conductive layer which corresponds to a cathode\an electroluminescent layer\a conductive layer which corresponds to an anode are laminated from the bottom. An appropriate structure may be selected depending on a conductivity type of a TFT that drives the light-emitting element or the direction of a current flown to the light-emitting element. Any one of organic materials (low molecular, middle molecular, and high molecular weight materials), inorganic materials, a singlet material, a triplet material, or a material in which one or a plurality of materials selected from the above four materials are combined may be used for the electroluminescent layer. Light emitted from the light-emitting element includes fluorescence and phosphorescence, and either or both are used for the display device of the invention. The light-emitting element provides a wide viewing angle and realizes a small-size, thin-shaped, and lightweight display device since a backlight is not necessary, moreover, is applicable to moving image. A display device that realizes sophistication and a high added value can be provided. This embodiment can be arbitrarily combined with the above-mentioned embodiment mode and embodiments.

This application is based on Japanese Patent Application serial no. 2004-007387 filed in Japanese Patent Office on Jan. 14 in 2004, the contents of which are hereby incorporated by reference.

What is claimed is:

1. A display device comprising:
   a substrate comprising:
      a pixel comprising a first sub-pixel having a first pixel electrode and a second sub-pixel having a second, pixel electrode;
      an electroluminescent layer over the first pixel electrode and the second pixel electrode, the electroluminescent layer overlapping with the first pixel electrode and the second pixel electrode;
      an opposite electrode over the electroluminescent layer, the opposite electrode overlapping with the first pixel electrode and the second pixel electrode;
      a first reflective layer over the opposite electrode, the first reflective layer overlapping with the first pixel electrode;
      a second reflective layer under the second pixel electrode, the second reflective layer overlapping with the second pixel electrode;
      a first source driver which supplies a first video signal for the first sub-pixel; and
      a second source driver which is different from the first source driver and supplies
   a second video signal for the second sub-pixel;
   a counter substrate; and
   a sealant,
   wherein the substrate and the counter substrate have light-transmitting properties and are bonded to each other by the sealant, and
   wherein the first pixel electrode, the second pixel electrode and the opposite electrode have light-transmitting properties.

2. A device according to claim 1, wherein the number of transistors including the first sub-pixel and the number of transistors including the second sub-pixel are the same.

3. A device according to claim 1, wherein the number of transistors including the first sub-pixel and the number of transistors including the second sub-pixel are different.

4. A device according to claim 1, wherein each of the first sub-pixel and the second sub-pixel is configured to emit one of red, green, and blue light.

5. A device according to claim 1, wherein each of the first sub-pixel and the second sub-pixel is configured to emit white light.

6. A device according to claim 1, wherein the first source driver is connected to a first digital data line and the second source driver is connected to a second digital data line.

7. A device according to claim 1, wherein the first source driver is connected to a digital data line and the second source driver is connected to an analog data line.

8. A device according to claim 1, wherein the first source driver is connected to a first analog data line and the second source driver is connected to a second analog data line.

9. An electronic device using the display device according to claim 1.

10. A device according to claim 9, wherein said electronic device is selected from the group consisting of a television apparatus, a digital camera, a digital video camera, a cellular phone device, a portable information terminal, a portable game machine, a monitor, a personal computer, a tablet PC, an audio reproducing device, and an image reproducing device provided with a recording medium.

11. A display device comprising:
    a substrate comprising:
       a pixel comprising a first sub-pixel having a first pixel electrode and a second sub-pixel having a second, pixel electrode;
       an electroluminescent layer over the first pixel electrode and the second pixel electrode, the electroluminescent layer overlapping with the first pixel electrode and the second pixel electrode;
       an opposite electrode over the electroluminescent layer, the opposite electrode overlapping with the first pixel electrode and the second pixel electrode;
       a reflective layer over the opposite electrode, the reflective layer overlapping with the first pixel electrode;
       a first source driver which supplies a first video signal for the first sub-pixel; and
       a second source driver which is different from the first source driver and supplies a second video signal for the second sub-pixel;
    a counter substrate; and
    a sealant,
    wherein the substrate and the counter substrate have light-transmitting properties and are bonded to each other by the sealant,
    wherein the first pixel electrode and the opposite electrode have light-transmitting properties, and
    wherein the second pixel electrode has reflectiveness.

12. A device according to claim 11, wherein the number of transistors including the first sub-pixel and the number of transistors including the second sub-pixel are the same.

13. A device according to claim 11, wherein the number of transistors including the first sub-pixel and the number of transistors including the second sub-pixel are different.

14. A device according to claim 11, wherein each of the first sub-pixel and the second sub-pixel is configured to emit one of red, green, and blue light.

15. A device according to claim 11, wherein each of the first sub-pixel and the second sub-pixel is configured to emit white light.

16. A device according to claim 11, wherein the first source driver is connected to a first digital data line and the second source driver is connected to a second digital data line.

17. A device according to claim 11, wherein the first source driver is connected to a digital data line and the second source driver is connected to an analog data line.

18. A device according to claim 11, wherein the first source driver is connected to a first analog data line and the second source driver is connected to a second analog data line.

19. A device according to claim 11,
    wherein a first display region using the first sub-pixel is displayed on the substrate,
    wherein a second display region using the second sub-pixel is displayed on the counter substrate, and wherein a first color display is performed in the first display region and a second color display is performed in the second display region.

20. A device according to claim 11,
wherein a first display region using the first sub-pixel is displayed on the substrate,
wherein a second display region using the second sub-pixel is displayed on the counter substrate, and
wherein a color display is performed in the first display region and a monochrome display is performed in the second display region.

21. A device according to claim 11,
wherein a first display region using the first sub-pixel is displayed on the substrate,
wherein a second display region using the second sub-pixel is displayed on the counter substrate, and
wherein a first monochrome display is performed in the first display region and a second monochrome display is performed in the second display region.

22. A device according to claim 11, further comprising a color filter on one or both of one surface of the substrate and one surface of the counter substrate.

23. A device according to claim 11, further comprising a color conversion layer on one or both of one surface of the substrate and one surface of the counter substrate.

24. An electronic device using the display device according to claim 11.

25. A device according to claim 24, wherein said electronic device is selected from the group consisting of a television apparatus, a digital camera, a digital video camera, a cellular phone device, a portable information terminal, a portable game machine, a monitor, a personal computer, a tablet PC, an audio reproducing device, and an image reproducing device provided with a recording medium.

26. A display device comprising:
a substrate comprising:
a pixel comprising a first sub-pixel having a first pixel electrode and a second sub-pixel having a second pixel electrode;
an electroluminescent layer over the first pixel electrode and the second pixel electrode, the electroluminescent layer overlapping with the first pixel electrode and the second pixel electrode;
an opposite electrode over the electroluminescent layer, the opposite electrode overlapping with the first pixel electrode and the second pixel electrode;
a first reflective layer over the opposite electrode, the first reflective layer overlapping with the first pixel electrode;
a second reflective layer under the second pixel electrode, the second reflective layer overlapping with the second pixel electrode;
a first source driver which supplies a first video signal for the first sub-pixel; and
a second source driver which is different from the first source driver and supplies a second video signal for the second sub-pixel;
a counter substrate; and
a sealant,
wherein the substrate and the counter substrate have light-transmitting properties and are bonded to each other by the sealant,
wherein the first pixel electrode, the second pixel electrode and the opposite electrode have light-transmitting properties,
wherein a first display region using the first sub-pixel is displayed on the substrate, and
wherein a second display region using the second sub-pixel is displayed on the counter substrate.

27. A device according to claim 26, wherein the number of transistors including the first sub-pixel and the number of transistors including the second sub-pixel are the same.

28. A device according to claim 26, wherein the number of transistors including the first sub-pixel and the number of transistors including the second sub-pixel are different.

29. A device according to claim 26, wherein each of the first sub-pixel and the second sub-pixel is configured to emit one of red, green, and blue light.

30. A device according to claim 26, wherein each of the first sub-pixel and the second sub-pixel is configured to emit white light.

31. A device according to claim 26, wherein the first source driver is connected to a first digital data line and the second source driver is connected to a second digital data line.

32. A device according to claim 26, wherein the first source driver is connected to a digital data line and the second source driver is connected to an analog data line.

33. A device according to claim 26, wherein the first source driver is connected to a first analog data line and the second source driver is connected to a second analog data line.

34. A device according to claim 26, wherein a first color display is performed in the first display region and a second color display is performed in the second display region.

35. A device according to claim 26, wherein a color display is performed in the first display region and a monochrome display is performed in the second display region.

36. A device according to claim 26, wherein a first monochrome display is performed in the first display region and a second monochrome display is performed in the second display region.

37. A device according to claim 26, further comprising a color filter on one or both of one surface of the substrate and one surface of the counter substrate.

38. A device according to claim 26, further comprising a color conversion layer on one or both of one surface of the substrate and one surface of the counter substrate.

39. An electronic device using the display device according to claim 26.

40. A device according to claim 39, wherein said electronic device is selected from the group consisting of a television apparatus, a digital camera, a digital video camera, a cellular phone device, a portable information terminal, a portable game machine, a monitor, a personal computer, a tablet PC, an audio reproducing device, and an image reproducing device provided with a recording medium.

41. A device according to claim 1, wherein the first reflective layer is in contact with the opposite electrode.

42. A device according to claim 1, wherein the second reflective layer is not in contact with the second pixel electrode.

43. A device according to claim 11, wherein the reflective layer is in contact with the opposite electrode.

44. A device according to claim 11, wherein the reflective layer is not in contact with the opposite electrode.

45. A device according to claim 26, wherein the first reflective layer is in contact with the opposite electrode.

46. A device according to claim 26, wherein the second reflective layer is not in contact with the second pixel electrode.

* * * * *